United States Patent [19]

Itakura et al.

[11] Patent Number: 5,418,795
[45] Date of Patent: May 23, 1995

[54] VITERBI DECODER WITH PATH METRIC COMPARISONS FOR INCREASED DECODING RATE AND WITH NORMALIZATION TIMING CALCULATION

[75] Inventors: Eisaburo Itakura; Yuichi Kojima, both of Kanagawa, Japan

[73] Assignee: Sony Corporation, Tokyo, Japan

[21] Appl. No.: 940,291

[22] Filed: Sep. 3, 1992

[30] Foreign Application Priority Data

Sep. 13, 1991 [JP] Japan .................................. 3-261397
Sep. 13, 1991 [JP] Japan .................................. 3-261399

[51] Int. Cl.6 .................... H03M 13/00; H03M 13/12
[52] U.S. Cl. .................................. 371/30; 340/146.2; 341/94; 341/107; 371/43
[58] Field of Search ...................... 371/43, 30; 364/582, 364/748; 395/2.51; 341/94, 107; 340/146.2

[56] References Cited

U.S. PATENT DOCUMENTS

| 4,905,317 | 2/1990 | Suzuki | 341/51 |
| 5,042,036 | 8/1991 | Fettweis | 371/43 |
| 5,208,816 | 4/1993 | Seshardi et al. | 371/43 |

FOREIGN PATENT DOCUMENTS

| 409205 | 1/1991 | European Pat. Off. |
| 59-19454 | 5/1984 | Japan |
| 62-178020 | 1/1988 | Japan |

OTHER PUBLICATIONS

Thapar, Hemant K. "A block processing method for designing high-speed Viterbi detectors", CH2655-9/89/0000-1096, pp. 1096-1100.
H. D. Lin, "Algorithms and Architectures For Concurrent Viterbi Decoding," World Prosperity Through Communications—Proceedings of the International Conference on Communications, Boston, IEEE, Jun. 1989, pp. 836-840.
K. Wen, "A New Transform Algorithm for Viterbi Decoding," IEEE Transactions on Communications, vol. 38, No. 6, Jun. 1990.

*Primary Examiner*—Stephen M. Baker
*Attorney, Agent, or Firm*—Jay H. Maioli

[57] ABSTRACT

A Viterbi decoding apparatus includes a brand metric calculation circuit for calculating a branch metric for a plurality of time slots at one time by an add-compare-select-state-metric (ACS-SM) calculation circuit for performing add-compare-select (ACS) calculation an add-compare-select-state-metric calculation circuit according to a branch metric for a plurality of time slots obtained by the branch metric calculation circuit and a state metric in the preceding stage at intervals of a plurality of time slots, and a maximum likelihood sequence decision circuit for decoding input data according to the content of the path obtained through the ACS calculation, wherein on the outside of a loop composed of the ACS-SM normalization circuit and a state metric storage circuit, there is provided a normalization command circuit, whereby a decision as to the necessity for normalization, a setting of the timing of normalization, and the like are performed, and, when it is decided that normalization is necessary, the state metric normalized through a bit shifting process in the ACS-SM normalization circuit is selected before at least any one of the state metrics overflows and the selected state metric is output as a new state metric.

4 Claims, 7 Drawing Sheets

VITERBI DECODER WITH PATH METRIC COMPARISONS FOR INCREASED DECODING RATE AND WITH NORMALIZATION TIMING CALCULATION

BACKGROUND OF THE INVENTION

1. Field of the Invention

The present invention relates to a Viterbi decoding apparatus for use in satellite broadcasting.

2. Description of the Related Art

As one of the decoding methods of a convolutional code, there is known a Viterbi decoding method.

The Viterbi decoding method is a maximum likelihood decoding method of a convolutional code. An error correction is achieved by selecting the sequence closest to the received code sequence (which is called the maximum likelihood path) out of the code sequences which can be generated by an encoder on the transmission side.

The method for selecting the maximum likelihood path is not one that confirms it by comparing all of the paths, but, in principle, is one that obtains the Hamming distances between all of the code sequences generated on the transmission side and the received code sequence and selects the smallest one of them (i.e.,-that has the maximum likelihood) and, thereafter, checks only the paths necessary for decoding (surviving paths). If a path of a sufficient length is taken, the ends (bases) of the surviving paths meet one another at the same value and, hence, it is known that the same value is decoded whichever surviving path is taken, if it is traced back.

Therefore, by determining a path length that will not produce a high error rate, the data at the point of time traced back through the path of that length can be used as the decoded data.

Figure 5:
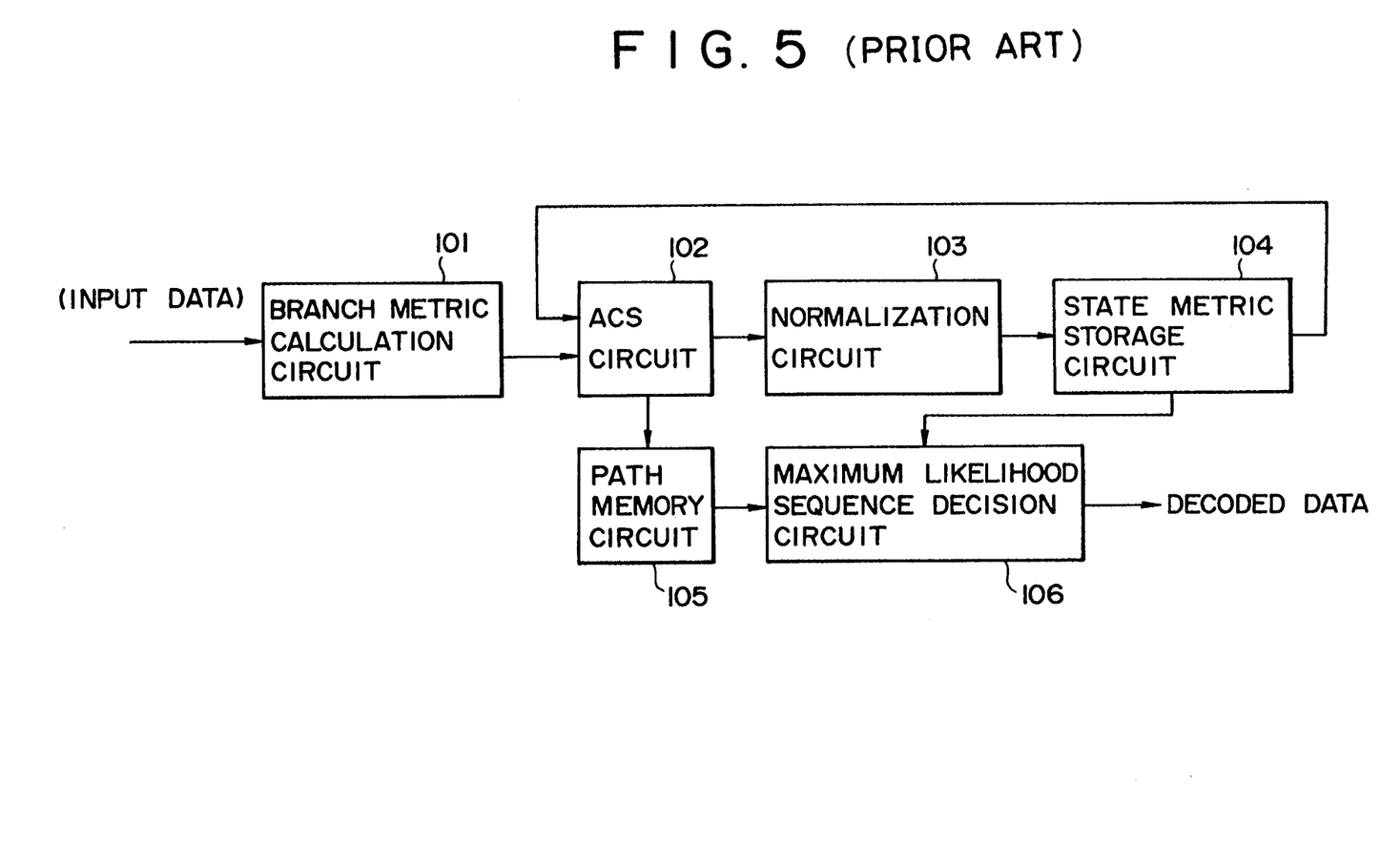
FIG. 5 is a block diagram showing an example of a Viterbi decoding apparatus which has heretofore been known.

FIG. 5 is a block diagram showing an example of a Viterbi decoding apparatus using such a Viterbi decoding method as described above.

The Viterbi decoding apparatus shown in FIG. 5 comprises a branch metric calculation circuit 101, an ACS add-compare-select circuit 102, a normalizaion circuit 103, a state metric storage circuit 104, a path memory circuit 105, and a maximum likelihood sequence decision circuit 106, and when data output from the transmission side (input data) is input to this circuit, the sequence closest to the received code sequence is selected from the code sequences which can be generated by the encoder on the transmission side and the decoded data is generated according to the selected content.

The branch metric calculation circuit 101, when the input data is input, calculates the branch metric of the input data (the Hamming distance between the received code and the path) and supplies the result of calculation (branch metric) to the ACS circuit 102.

The ACS circuit 102, according to the branch metric supplied from the branch metric calculation circuit 101 and a state metric (accumulation) supplied from the state metric storage circuit 104 adds up, with respect to each of two paths meeting each other at a state, the branch metric for the path and the accumulation of the branch metrics up to the preceding stage (state metric), compares the sums with each other, and selects, according to the results of comparison, the one being higher in likelihood, and then, supplies the content or the selection to the path memory circuit 105 and, also, supplies the sum being higher in likelihood to the normalization circuit 103 as a newly obtained accumulation (state metric).

Figure 6:
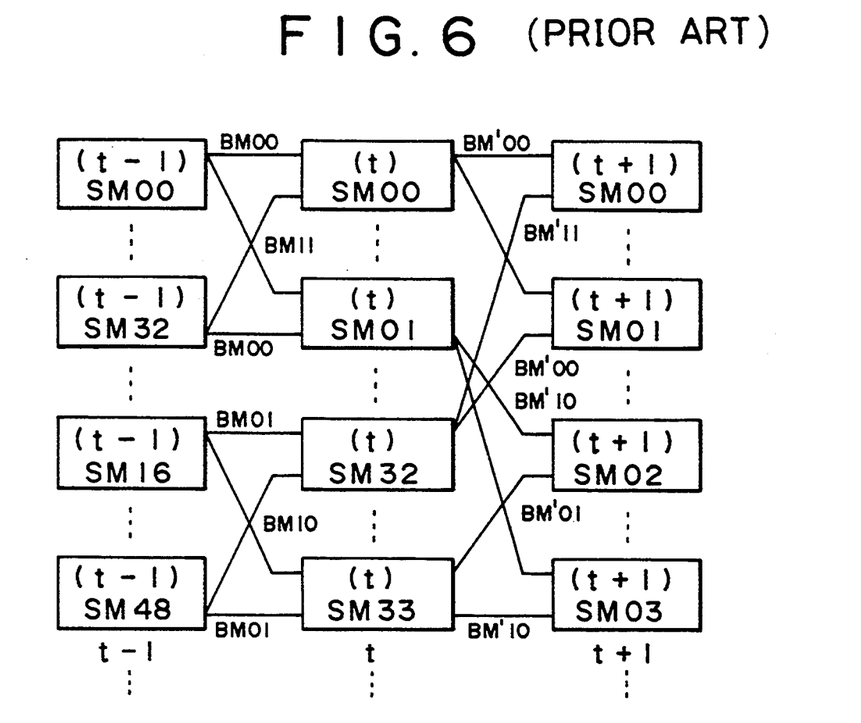
FIG. 6 is a transition diagram for two time slots showing an example of an operation of an ACS circuit shown in FIG. 5.

When, in this case, the constraint length is "7" and the number of states is "64" the Hamming distance between the received code and the path (branch metric) and the accumulation of the branch metrics up to the preceding stage (state metric) with respect to each of the two paths meeting each other at a state are added up for each time slot as shown in the transition diagram shown in FIG. 6 and the results of addition are compared with each other and, according to the results of comparison, the one being higher in likelihood is selected.

The normalization circuit 103 normalizes the state metric output from the ACS circuit 102 to a value within a preset range and supplies this normalized state metric to the state metric storage circuit 104.

The state metric storage circuit 104 stores the normalized state metric supplied from the normalization circuit 103 and, at the same time, feeds back each state metric stored therein to the ACS circuit 102.

The path memory circuit 105 stores the selected content output from the ACS circuit 102 and supplies this selected content to the maximum likelihood sequence decision circuit 106.

The maximum likelihood sequence decision circuit 106, according to the selected content stored in the path memory circuit 105 and the stored content in the state metric storage circuit 104, determines the path having the maximum likelihood to generate decoded data and outputs the decoded data.

Since, in the Viterbi decoding apparatus as described above, the value of the state metric in the preceding decoding stage is added in the current decoding stage, circuits from the state metric storage circuit 104 are connected to the adder (not shown) in the ACS circuit 102 in the form of a loop.

Since the computation in the loop must be performed within the information rate, it is necessary, in order to increase the information rate, to lower the maximum value of the time required in the loop portion.

In this case, the circuits having the greatest influence on the operation speed of those within the loop are the ACS circuit 102, which adds up the Hamming distance between the received code and the path (branch metric) and the accumulation of the branch metrics up to the preceding stage (state metric) for each of the two paths meeting each other at a state, compares the sums with each other, and selects the one being higher in likelihood, and the normalization circuit 103, which normalizes the state metric output from the ACS circuit 102.

Figure 7:
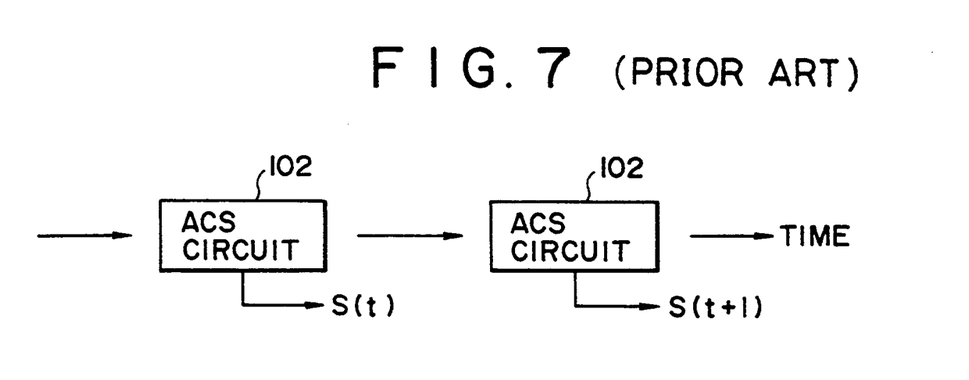
FIG. 7 is a schematic diagram showing the time required for computation in the ACS circuit shown in FIG. 5.

However, the ACS circuit 102 of the conventional type used in such a Viterbi decoding apparatus as described above, when outputting path selection signals $S_{(t)}$, $S_{(t+1)}$, ..., which correspond to transition information of the paths, for each time slot as shown in FIG. 7, requires the time $T_T$, as the computation time, expressed as $$T_T = T_A + T_C + T_S, \qquad (1)$$

where
 $T_A$: time required for addition,
 $T_C$: time required for comparison,
 $T_S$: time required for selection.

Further, in order to increase the information rate by reducing this time, $T_T$, very precise synchronous clocking must be achieved.

Therefore, if the information rate is increased with the conventional circuit configuration used, such a problem in the circuit operation arises in that the transition time easily shifts and control of the clocking becomes difficult.

Further, a certain length of processing time for normalization is required in the normalization circuit 103 because various processes are to be performed therein such as making a decision on normalization, setting the normalization timing, and performing the normalization process.

Therefore, the information rate cannot be increased unless the processing speed in the loop portion is reduced by shortening the above described processing time.

Further, in the conventional Viterbi decoding apparatus, especially the apparatus that treats a punctured code with a large constraint length and has a large circuit scale, it is required that the number of bits of the state metric is reduced as much as possible and the circuit scale is made small.

In such a Viterbi decoding apparatus, the value of the state metric selected by the ACS circuit 102 continually increases with time because it is the sum total of the branch metrics of the surviving paths. Hence, it is arranged such that the value of the state metric selected by the ACS circuit 102 is normalized under a predetermined condition by the normalization circuit 103 provided in the stage subsequent to the ACS circuit 102.

What is most preferable as the method of normalization at this time is to subtract, from all of the state metrics, the minimum value of them, but if the values of the state metrics output from the ACS circuit 102 are normalized by such a method, the processing speed in the entire loop becomes low.

Accordingly, with the conventional circuit configuration, the maximum operation speed is determined by the computation speed in the loop in one time slot, and therefore, in the case where the constraint length is "7" and the encode rate is "⅔", 25 Mbps is the attainable upper limit by the technology level at present.

Therefore, there has been a problem that an information rate of 30 Mbps or above as required in decoding a convolutional code used in HDTV broadcasting or the like cannot be processed.

SUMMARY OF THE INVENTION

The present invention has been made in view of the above described various problems. Accordingly, it is an object of the present invention to provide a Viterbi decoding apparatus capable of decoding a convolutional code having an information rate over 30 Mbps used in HDTV broadcasting or the like.

According to a first aspect of the present invention, there is provided a Viterbi decoding apparatus for decoding input data by a Viterbi decoding method comprising a branch metric calculation circuit for calculating a branch metric for a plurality of time slots at one time, an ACS calculation circuit for performing an ACS calculation according to a branch metric for a plurality of time slots obtained by said branch metric calculation circuit and a state metric in the preceding stage, and a maximum likelihood sequence decision circuit for decoding the input data according to the content of the path obtained by said ACS calculation circuit.

With the above described arrangement, while a branch metric for a plurality of time slots is calculated at one time by the branch metric calculation circuit, an ACS calculation is performed by the ACS calculation circuit according to a branch metric for a plurality of time slots obtained by the branch metric calculation circuit and a state metric in the preceding stage at intervals of a plurality of time slots, and input data is decoded by a maximum likelihood sequence decision circuit according to the content of the path obtained by the ACS calculation.

According to a second aspect of the present invention, there is provided a Viterbi decoding apparatus for decoding input data by a Viterbi decoding method comprising a branch metric calculation circuit for calculating a branch metric for input data, a state metric storage circuit for storing a state metric in the preceding stage, a computation circuit for computing a new state metric according to a branch metric calculated by the branch metric calculation circuit and the state metric in the preceding stage stored in the state metric storage circuit, a normalization command circuit for deciding normalization timing by detecting the most significant bit (MSB) of any of the state metrics obtained by the computation circuit becoming "1" and making a predictive calculation of the time interval in which none of the state metrics overflows, and outputting a normalization command according to the decision, a selection-normalization portion for generating a normalized state metric by shifting a newly obtained state metric from the computation circuit toward the least significant bit (LSB) side and also generating a state metric before being normalized, and selecting, when a normalization command is output from the normalization command circuit, the normalized state metric and causing the state metric storage circuit to store the normalized state metric as a new state metric, while selecting, when there is no normalization command output from the normalization command circuit, a state metric before being normalized and causing the state metric storage circuit to store the unnormalized state metric as a new state metric, and a maximum likelihood sequence decision circuit for decoding input data according to the content of the path obtained in the state metric computation process performed by the computation circuit.

With the above described arrangement, a new state metric is computed by the computation circuit according to the branch metric for the input data and the state metric in the preceding stage, and, when the MSB of at least one of the state metrics obtained by the computation circuit is "1", it is detected by the normalization command circuit, and the time interval in which none of the state metrics overflows is obtained through a predictive calculation, the normalization timing is thus decided, and the normalization command is output according to the decision.

In parallel with the above described operations, the new state metric obtained by the computation circuit is shifted to the LSB side by the selection-normalization portion and thereby a normalized state metric is generated and also a state metric before being normalized is generated, and, when there is a normalization command output from the normalization command circuit, the normalized state metric is selected and this is stored in the state metric storage circuit as a new state metric and, when there is no normalization command output from the normalization command circuit, the unnormalized state metric is selected and this is stored in the state metric storage circuit as a new state metric, and thus, the input data is decoded according to the content of the path obtained by the state metric computation process performed by the computation circuit.

DESCRIPTION OF THE PREFERRED EMBODIMENTS

Figure 8:
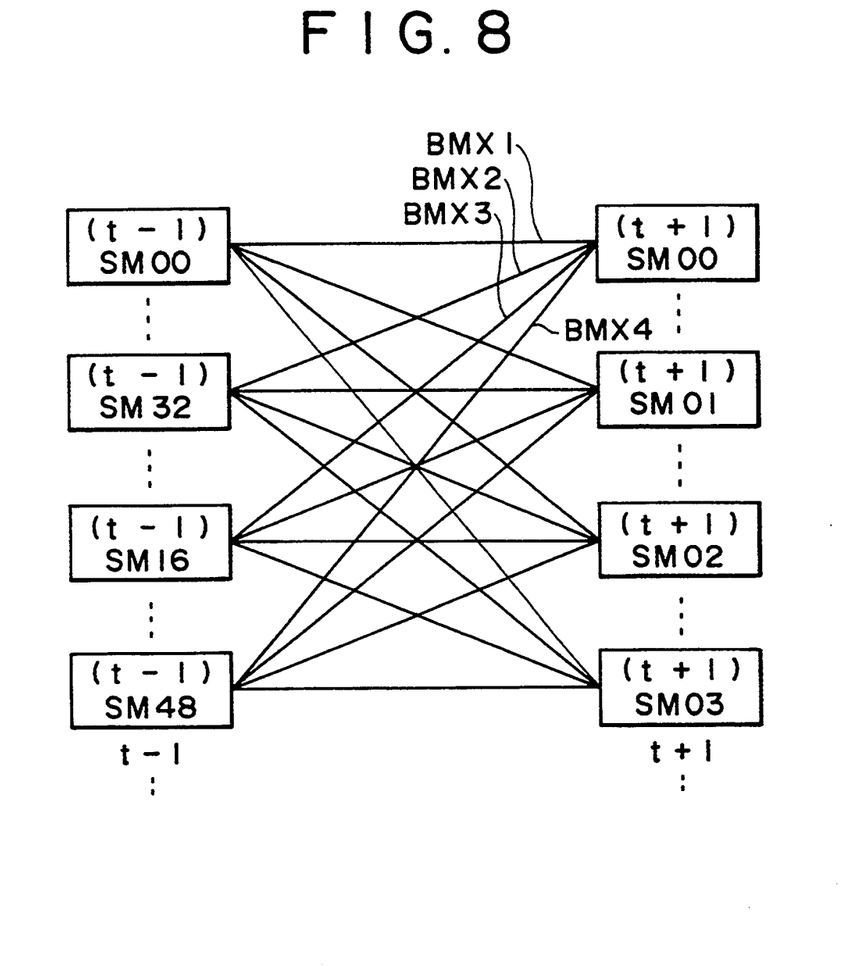
FIG. 8 is a transition diagram for two time slots showing the basic principle of the Viterbi decoding apparatus according to the present invention.

Before making a detailed description of the present invention, the basic principle of the present invention will be described with reference to FIG. 8.

Assuming now that the constraint length of the input data is "7" and the number of states is "64", computations have been made in the conventional method to select, out of the paths coming into each state node, the path having a minimal distance from the received code at intervals of one time slot as shown in FIG. 6. In the present invention, however, computations are made to select, out of the paths coming into each state node, the path having a minimal distance from the received code at intervals of two time slots as shown in FIG. 8, so that the time which has been required for each time slot for the process of adding the state metric for and the branch metric, the process of comparing the results of addition, and for the process of selecting each path is required only once for each of two time slots. Thus, the time required for the process for the two time slots, $T_T$, is expressed as $$T_T' = T_A' + T_C' + T_S', \quad (2)$$

where $T_A'$: time required for addition,
$T_C'$: time required for comparison,
$T_S'$: time required for selection.

Even if the method is arranged as above, the condition of transition from four states to four states is not changed. Further, even if the state in the middle is eliminated, the information required is only the decoded word of the selected path and the transition information. Therefore, even if the ACS calculation is performed at intervals of two time slots, the exact same results as those obtained in the conventional calculation at intervals of one time slot can be obtained by causing the decoded word from the path memory circuit to make a transition according to a transition diagram for two time slots in units of two bits.

Further, the time for addition $T_A'$, the time for comparison $T_C'$, and the time for selection $T_S'$ take on virtually the same values as the time for addition $T_A$, the time for comparison $T_C$, and the time for selection $T_S$ required for each time slot in the conventional method as given by $$T_A' \approx T_A$$

$$T_C' \approx T_C$$

$$T_S' \approx T_S \quad (3)$$

Figure 9:
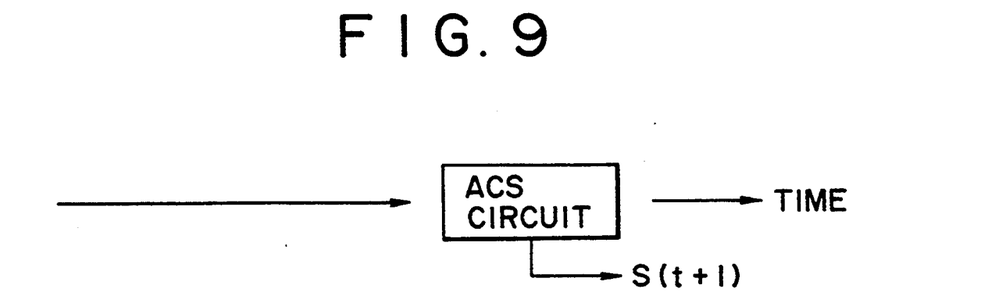
FIG. 9 is a schematic diagram showing the time required for an ACS computation in the present invention.

Hence, while the time "$2 T_T$" is required for performing processes for two time slots in the conventional method as shown in FIG. 7, the processes for two time slots can be performed in the time "$T_T'$" (where $T_T' \approx T_T$), virtually half the time required in the conventional method, by the method of the present invention as shown in FIG. 9.

Further, in the present invention, processes necessary for normalization such as a normalization deciding process and a normalization timing process are performed outside the loop formed between the ACS circuit and the state metric storage circuit. Furthermore, the ACS circuit and the normalization circuit are integrally formed, and the state metric obtained through the ACS processing is shifted toward the LSB side and thereby the state metric is normalized, and thereafter, when it is decided that normalization is necessary through the normalization deciding process, the normalized state metric is selected or the state metric before being normalized is selected, so that the processing speed of the loop is increased.

Figure 1:
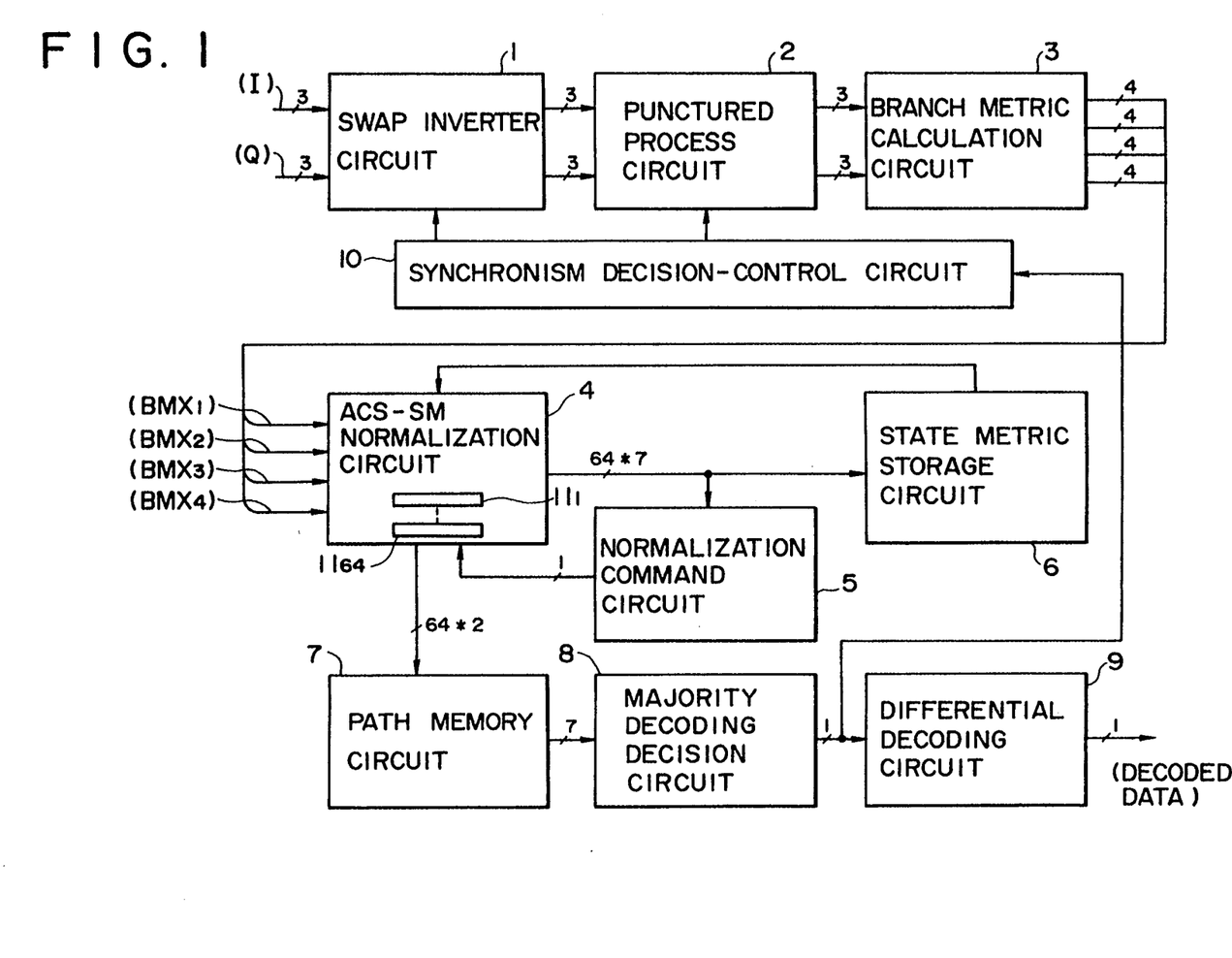
FIG. 1 is a block diagram showing an embodiment of a Viterbi decoding apparatus according to the present invention.

FIG. 1 is a block diagram showing an embodiment of the Viterbi decoding apparatus according to the present invention based on the above described basic principle.

The Viterbi decoding apparatus shown in FIG. 1 comprises a swap inverter circuit 1, a punctured process circuit 2, a branch metric calculation circuit 3, an ACS-SM normalization circuit 4, a normalization command circuit 5, a state metric storage circuit 6, a path memory circuit 7, a majority decoding decision circuit 8, a differential decoding circuit 9, and a synchronism decision-control circuit 10. When data (input data) from the transmission side is input, the sequence closest to the received code sequence is selected from the code sequences which can be generated by the encoder on the transmission side and decoded data is generated according to the selected content.

The swap-inverter circuit 1 accepts the input data under the control command from the synchronism decision-control circuit 10 and applies a swap process and an inversion process to the input data and, thereafter, supplies the processed input data to the punctured process circuit 2.

The punctured process circuit 2 accepts the input data output from the swap-inverter circuit 1 under the control command from the synchronism decision-control circuit 10 and applies a punctured process to the input data and, thereafter, supplies the processed input data to the branch metric calculation circuit 3.

The branch metric calculation circuit 3 accepts the input data output from the punctured process circuit 2 and calculates the branch metric of the input data and, thereafter, supplies the result of calculation (branch metric) to the ACS-SM normalization circuit 4.

The ACS-SM normalization circuit 4 comprises 64 unitary processing circuits $11_1$ to $11_{64}$. This ACS-SM normalization circuit 4, according to the branch metric supplied from the branch metric calculation circuit 3 and the state metric (accumulation) supplied from the state metric storage circuit 6, adds, with respect to each of four paths coming into a state, the Hamming distance (branch metric) between the received code and the path and the accumulation (state metric) of the branch metrics up to the preceding stage to obtain the sum, compares the sums for the four paths, and selects, according to the results of comparison, the sum having the maximum likelihood. The ACS-SM circuit 4 then supplies the selected content to the path memory circuit 7, and further, when there is no normalization command signal ("0" signal) output from the normalization command circuit 5, supplies the above obtained sum as it is to the normalization command circuit 5 and the state metric storage circuit 6 as a newly obtained accumulation (state metric). When there is a normalization command signal output from the normalization command circuit 5, the ACS-SM circuit 4 normalizes the above obtained sum so as to obtain a value within a preset range and supplies it to the normalization command circuit 5 and to the state metric storage circuit 6 as a newly obtained accumulation (state metric).

Figure 2:
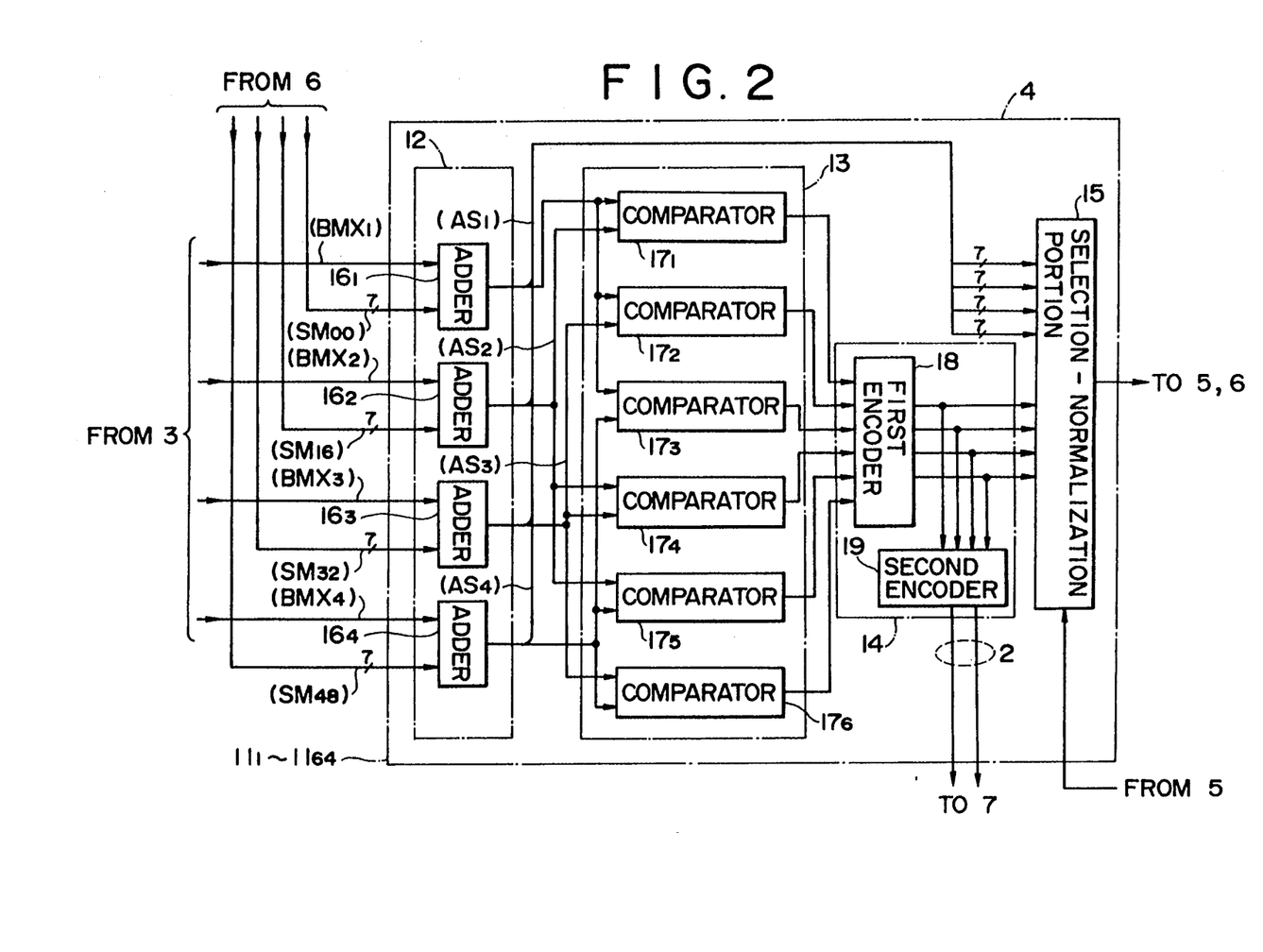
FIG. 2 is a block diagram showing an example of the detailed structure of an ACS-SM (add-compare-select-state-metric) normalization circuit shown in FIG. 1.

Each of the unitary processing circuits $11_1$ to $11_{64}$, as shown in FIG. 2, comprises an adding portion 12, a comparison portion 13, an encoder portion 14, and a selection-normalization portion 15. Each unitary processing circuit, according to the branch metric supplied from the Branch metric calculation circuit 3 and the state metric supplied from the state metric storage circuit 6, adds, with respect to each of four paths coming into a state, the Hamming distance (branch metric) between the received code and the path and the accumulation (state metric) of the branch metrics up to the preceding stage, compares the sums for the four paths, and selects, according to the results of comparison, the one having the maximum likelihood and supplies the selected content to the path memory circuit 7, and further, when there is no normalization command signal output from the normalization command circuit 5, supplies the newly obtained accumulation (state metric) as it is to the normalization command circuit 5 and to the state metric storage circuit 6 and, when there is a normalization command signal output from the normalization command circuit 5, applies a normalization process to the newly obtained state metric to obtain a value within a preset range and supplies it to the normalization command circuit 5 and to the state metric storage circuit 6.

The adding portion 12 comprises four adders $16_1$ to $16_4$ for adding the branch metrics for two time slots supplied from the branch metric calculation circuit 3 and the state metrics supplied from the state metric storage circuit 6 to thereby generate their sums, and to supply the four sums $AS_1$ to $AS_4$ obtained by the addition to the comparison portion 13 and to the selection-normalization portion 15.

In this case, if the objects of calculation by the unitary processing circuits $11_1$ to $11_{64}$, namely, the state nodes are state metrics $SM_{00}$, $SM_{16}$, $SM_{32}$, and $SM_{48}$ and the branch metrics are $BMX_1$, $BMX_2$, $BMX_3$, and $BMX_4$, then, sums (new state metrics) $AS_1$, $AS_2$, $AS_3$, and $AS_4$ of the values expressed as below are generated by the adding portion 12 and supplied to the comparison portion 13 and the selection-normalization portion 15:

$$AS_1 = SM_{00} + BMX_1$$
$$AS_2 = SM_{16} + BMX_2$$
$$AS_3 = SM_{32} + BMX_3$$
$$AS_4 = SM_{48} + BMX_4. \tag{4}$$

The comparison portion 13 comprises six comparators $17_1$ to $17_6$, each thereof selecting one, which is higher in likelihood than the other, of a combination made of two sums of the four sums $AS_1$, $AS_2$, $AS_3$, and $AS_4$ output from the adders $16_1$ to $16_4$. The comparison portion 13, forming combinations of two sums out of the four sums $AS_1$, $AS_2$, $AS_3$, and $AS_4$ output from the adders $16_1$ to $16_4$, compares values of the two sums with each other, to thereby generate signals each thereof indicating the sum having a higher likelihood than the other and supply them to the encoder portion 14.

The encoder portion 14 comprises a first encoder 18 for encoding the signals output from the comparators $17_1$ to $17_6$, constituting the comparison portion 13, to generate a 4-bit selection signal necessary for specifying one of the sums $AS_1$, $AS_2$, $AS_3$, and $AS_4$ output from the adding portion 12 and a second encoder 19 for encoding the 4-bit selection signal output from the first encoder 18 to generate a 2-bit selection signal, such that the encoder portion 14 encodes the signals output from the comparators $17_1$ to $17_6$ and generates a 4-bit selection signal for specifying one of the sums $AS_1$, $AS_2$, $AS_3$, and $AS_4$ output from the adding portion 12 and supplies this signal to the selection-normalization portion 15 and, further, encodes the selection signal and generates a 2-bit selection signal and supplies this signal to the path memory circuit 7.

Figure 3:
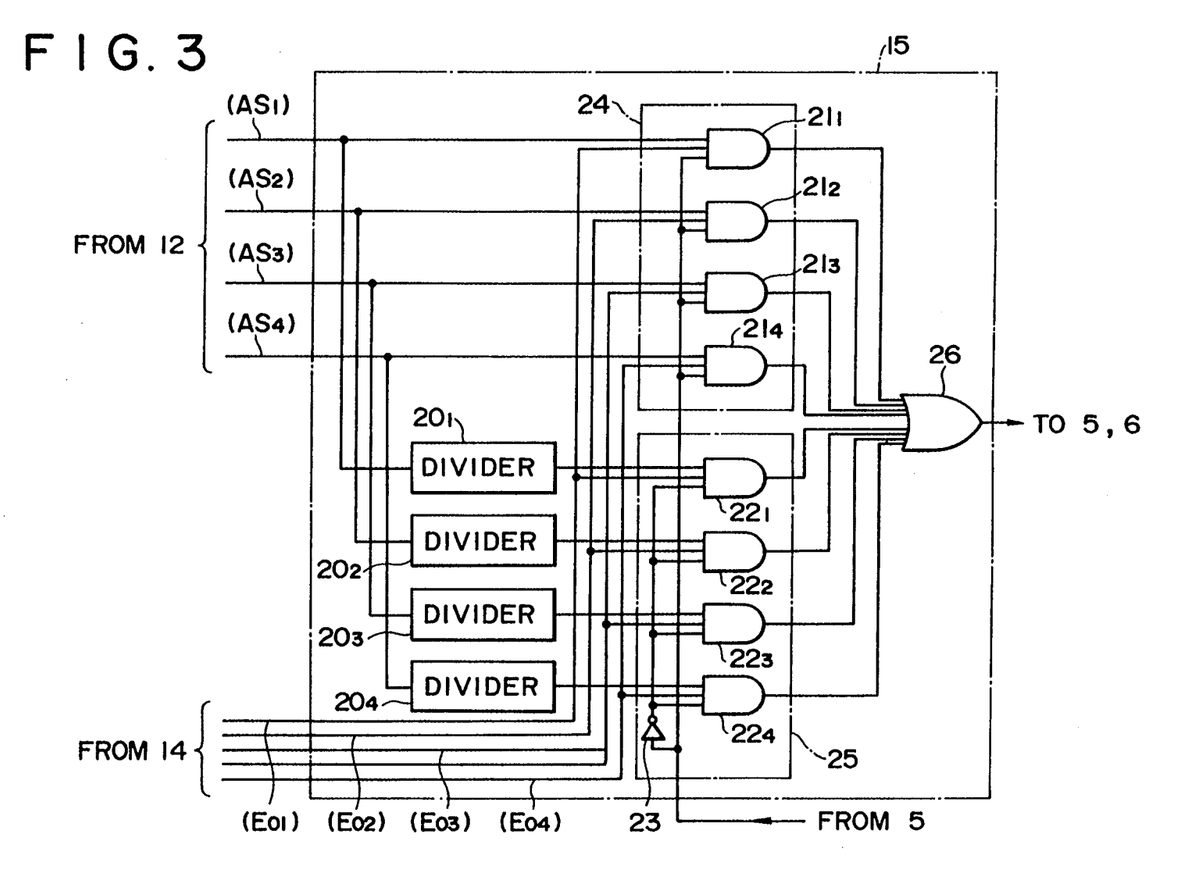
FIG. 3 is a circuit diagram showing an example of the detailed structure of a selection-normalization portion shown in FIG. 2.

The selection-normalization portion 15 comprises, as shown in FIG. 3, four dividers $20_1$ to $20_4$ for shifting the sums $AS_1$, $AS_2$, $AS_3$, and $AS_4$ output from the adding portion 12 toward the side of the LSB to thereby halve their values, a first selection portion 24 having four AND gates $21_1$ to $21_4$ for selecting, when there is no normalization command output from the normalization command circuit 5, the sum specified by the 4-bit selection signal output from the encoder portion 14 out of the sums $AS_1$, $AS_2$, $AS_3$, and $AS_4$ output from the adding portion 12, a second selection portion 25 having four AND gates $22_1$ to $22_4$ and an inverter 23 for selecting, when there is a normalization command output from the normalization command circuit 5, the sum specified by the 4-bit selection signal output from the encoder portion 14 out of the normalized sums $AS_1$, $AS_2$, $AS_3$, and $AS_4$ output from the dividers $20_1$ to $20_4$, and an OR gate 26 for accepting the sum selected either by the first selection portion 24 or by the second select portion 25 and outputting it as a new state metric.

The selection-normalization portion 15 generates normalized sums $AS_1$, $AS_2$, $AS_3$, and $AS_4$ by normalizing the sums $AS_1$, $AS_2$, $AS_3$, and $AS_4$ output from the adding portion 12 and unnormalized sums $AS_1$, $AS_2$, AS$_3$, and AS$_4$, and, when there is no normalization command output from the normalization command circuit 5, selects the sum specified by the 4-bit selection signal output from the encoder portion 14 out of the unnormalized sums AS$_1$, AS$_2$, AS$_3$, and AS$_4$ by means of the first selection portion 24 and supplies the selected sum to the normalization command circuit 5 and to the state metric storage circuit 6, and, when there is a normalization command output from the normalization command circuit 5, selects the sum specified by the 4-bit selection signal output from the encoder portion 14 out of the normalized sums AS$_1$, AS$_2$, AS$_3$, and AS$_4$ by means of the second selection portion 25 and supplies the selected sum to the normalization command circuit 5 and to the state metric storage circuit 6.

Figure 4:
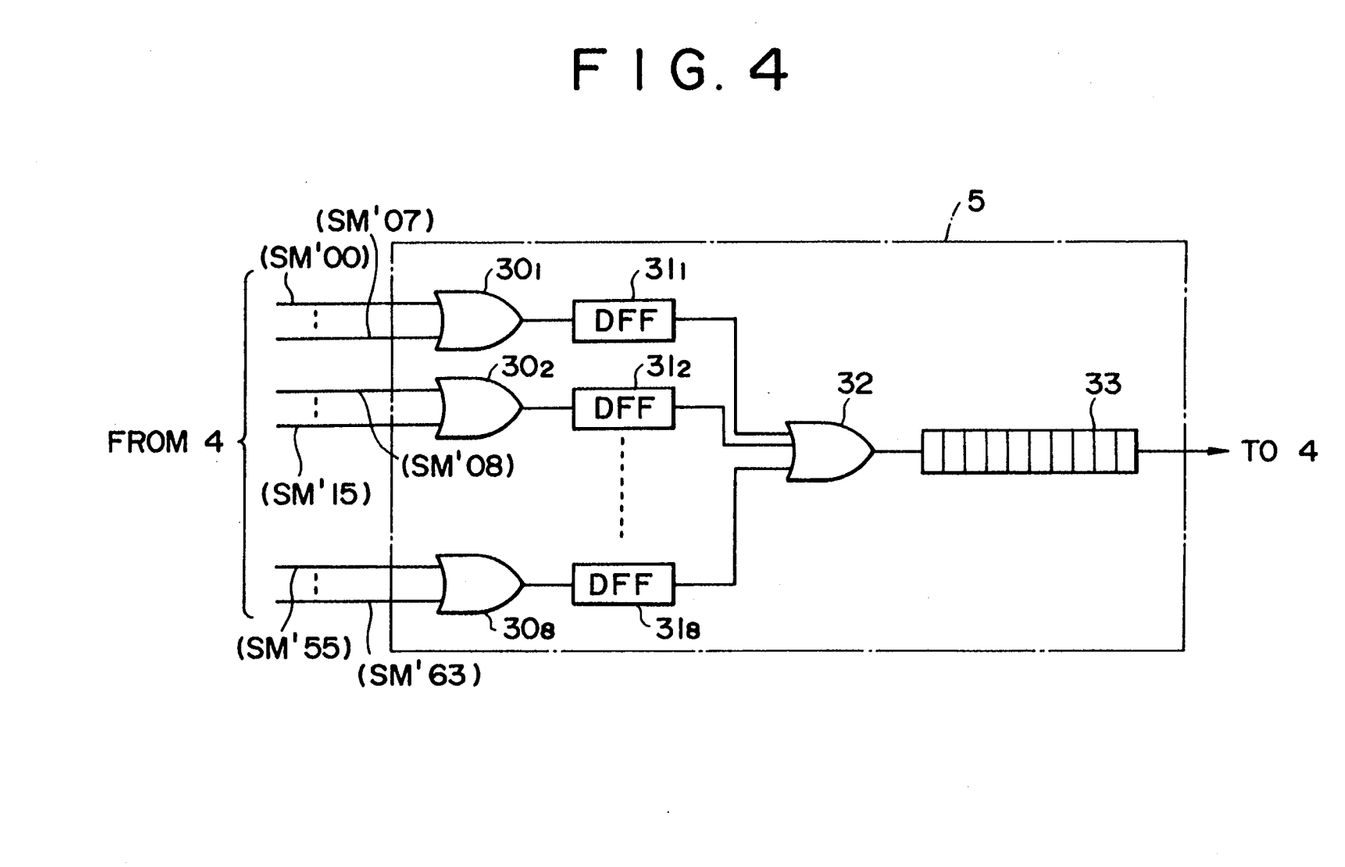
FIG. 4 is a circuit diagram showing an example of the detailed structure of a normalization command circuit shown in FIG. 1.

The normalization command circuit 5 comprises, as shown in FIG. 4, eight OR gates 30$_1$ to 30$_8$ accepting new state metrics output from the ACS-SM normalization circuit 4 and obtains the logical sum of eight units, eight D flip-flops 31$_1$ to 31$_8$ for delaying each of the logical sum data output from the OR gates 30$_1$ to 30$_8$ by one time slot, an OR gate 32 for obtaining the logical sum of the logical sum data output from the D flip-flops 31$_1$ to 31$_8$, and a normalization command generation circuit 33 having a shift register for delaying the logical sum data output from the OR gate 32 by preset time slots and, when the MSB of the same is "1", generating a normalization command ("0" signal). The normalization command circuit 5, when the MSB of any of the new state metrics output from the ACS-SM normalization circuit 4 is "1", generates the normalization command after predetermined time slots have passed and supplies it to the ACS-SM normalization circuit 4.

For example, if the number of bits of the state metric is 7 bits at its maximum and the input data is an 8-value soft decision input, then, the value of the state metric is increased by the maximum value "14" which the branch metric can take on for each time slot and the time from the moment its MSB became "1" to the moment immediately before overflow occurs is "3.5" time slots. Therefore, 0.5 time slot is delayed by the eight OR gates 30$_1$ to 30$_8$ and one OR gate 32, one time slot is delayed by the eight D flip-flops 31$_1$ to 31$_8$, and two time slots are delayed by the shift register 33, and, thereby, the normalization command is generated when 3.5 time slots have passed after the MSB of any of the new state metrics output from the ACS-SM normalization circuit 4 has become "1", and the command is supplied to the ACS-SM normalization circuit 4.

The state metric storage circuit 6 stores the state metric supplied from the ACS-SM normalization circuit 4 and supplies the state metrics stored therein to the ACS-SM normalization circuit 4.

The path memory circuit 7 stores the selected content output from the ACS-SM normalization circuit 4 and supplies the selected content to the majority decoding decision circuit 8.

The majority decoding decision circuit 8 decides, according to the selected content stored in the path memory circuit 7, the path which has the maximum likelihood, generates the decoded data, and supplies it to the differential decoding circuit 9 and to the synchronism decision-control circuit 10.

The differential decoding circuit 9 accepts the decoded data output from the majority decoding decision circuit 8, applies a differential decoding process to the decoded data to generate decoded data, and outputs it to the circuit in the subsequent stage (not shown).

The synchronism decision-control circuit 10, according to the decoded data output from the majority decoding decision circuit 8, makes a decision on synchronism and controls, according to the content of the decision, synchronism between the swap-inverter circuit 1 and the punctured process circuit 2.

In the present embodiment, as described above, it is arranged such that the ACS calculation is performed in units of two time slots. The time required for the ACS calculation for two time slots can be reduced to virtually half that required when the ACS calculation is made for one time slot at a time. Thus, it becomes possible to decode a convolutional code having an information rate of 30 Mbps or above used in HDTV broadcasting etc.

Further, in the present embodiment, there is provided, on the outside of the loop composed of the ACS-SM normalization circuit 4 and the state metric storage circuit 6, the normalization command circuit 5, whereby a decision as to the necessity for normalization, a setting of the normalization timing, and the like are performed, and, when it is decided that normalization is necessary, the state metric normalized by the ACS-SM normalization circuit 4 is selected before at least any one of the state metrics overflows and the selected state metric is output as the new state metric. Therefore, the operation of the entire loop can be performed at higher speeds than in the conventional circuit configuration in which adders provided in the ACS circuit, the normalization circuit, and the state metric storage circuit are connected in the form of a loop.

Further, in the above described embodiment, six comparators 17$_1$ to 17$_6$ are provided in the ACS-SM normalization circuit 4 so that the values of a combination of two sums out of the four sums AS$_1$, AS$_2$, AS$_3$, and AS$_4$ output from the adders 16$_1$ to 16$_4$ are compared with each other and the one being higher in likelihood than the other is selected. Therefore, the sums AS$_1$, AS$_2$, AS$_3$, and AS$_4$ can be compared for a decision at one time and the sum with the maximum likelihood can be obtained with a minimized delay time.

According to the present invention as described above, a convolutional signal having an information rate over 30 Mbps used in HDTV broadcasting or the like can be decoded.

What is claimed is:

1. A Viterbi decoding apparatus for decoding input data, comprising:
   branch metric calculation means for calculating a branch metric for said input data for a plurality of time slots;
   state metric storage means for storing a state metric formed of an accumulation of sequentially calculated branch metrics by said branch metric calculation means;
   add-compare-select computation means for performing, in a parallel manner, add-compare-select computations in a current processing stage on said branch metric for the plurality of time slots calculated by said branch metric calculation means and on said state metric supplied from said state metric storage means and formed of the accumulation of branch metrics for a period up to a preceding processing stage at intervals of the plurality of time slots for each of a plurality of paths coming into one state node, thereby obtaining a maximum likelihood path which has a maximum likelihood of being closest to a code sequence of said input data; and maximum likelihood sequence decision means for decoding said input data according to a content of said path obtained by said add-compare-select computation means at an interval of the plurality of time slots, wherein said add-compare-select computation means includes:

a plurality of adding means corresponding to said plurality of paths for adding said branch metric for the plurality of time slots calculated by said branch metric calculation means in the current processing stage and said state metric for the period up to the preceding processing stage stored in said state metric storage means for respective paths of said plurality of paths at intervals of the plurality of time slots and for outputting a plurality of added sums;

a plurality of comparison means for comparing each of said plurality of added sums with each other added sum and outputting a plurality of higher likelihood sums representing added sums having a higher likelihood than the other added sums based on the comparison; and selection means for selecting the maximum likelihood path which has the maximum likelihood according to results of the comparison made by said plurality of comparison means, wherein said selection means generates a first selection signal supplied to said state metric storage means and a second selection signal supplied to said maximum likelihood decision means.

2. The Viterbi decoding apparatus according to claim 1, wherein said plurality of adding means comprises four adding means;

said plurality of paths comprises four paths; and said plurality of comparison means comprises six comparison means.

3. The Viterbi decoding apparatus according to claim 2, wherein said plurality of time slots comprises two time slots.

4. A viterbi decoding apparatus for decoding input data comprising:

branch metric calculation means for calculating a branch metric for said input data;

state metric storage means for storing a state metric formed of an accumulation of sequentially calculated branch metrics by said branch metric calculation means;

computation means for computing a new state metric according to a branch metric calculated by said branch metric calculation means in a current processing stage and the state metric for the period up to a preceding processing stage stored in said state metric storage means;

normalization command means for calculating normalization timing through a predictive calculation of a maximum time interval from the point of time at which any of the most significant bits of the state metrics calculated by said computation means has become "1" to the point of time immediately before any of the state metrics overflows and for outputting a normalization command according to the calculation;

selection-normalization means for selecting a normalized state metric obtained by shifting a new state metric obtained by said computation means toward the side of the least significant bit and for causing said state metric storage means to store the normalized state metric as a new state metric when a normalization command is output from said normalization command means, and for selecting a state metric before being normalized and causing said state metric storage means to store the unnormalized state metric as a new state metric when a normalization command is not output from said normalization command means; and maximum likelihood sequence decision means for decoding said input data according to the content of a maximum likelihood path obtained by the state metric computation.

* * * * *